United States Patent [19]

Atherton

[11] Patent Number: 4,673,887
[45] Date of Patent: Jun. 16, 1987

[54] DIGITAL DRIVER FOR FIXED POWER AMPLIFIER

[75] Inventor: Jay W. Atherton, Seattle, Wash.

[73] Assignee: Honeywell Inc., Minneapolis, Minn.

[21] Appl. No.: 815,953

[22] Filed: Jan. 3, 1986

[51] Int. Cl.$^4$ .............................................. H03F 3/38
[52] U.S. Cl. .................................. 330/10; 330/207 A
[58] Field of Search ...................... 330/10, 207 A, 251;
332/9 R; 375/22; 323/283; 363/41

[56] References Cited

U.S. PATENT DOCUMENTS

4,166,247  8/1979  Miyazawa ......................... 363/41 X
4,390,849  6/1983  Miskin ............................... 330/10 X

*Primary Examiner*—James B. Mullins
*Attorney, Agent, or Firm*—Roger W. Jensen

[57] ABSTRACT

A digital power amplifier system features an analog signal which is converted to a corresponding digital signal and is, in turn, applied as input signals in a digital binary format to a digital pulse width modulator. The digital pulse width modulated signals are amplified in a digital or switching power amplifier. The resulting signals are then passed through a tuning or filter circuit to produce an analog signal having a desired frequency and wave shape characteristics. The analog signal is then applied to a suitable load device. In the thus provided amplification system, all of the signal processing and amplification is accomplished through digital or power switching circuitry with no analog influence until the amplified signals are applied to the tuning or filter elements.

12 Claims, 8 Drawing Figures

DIGITAL DRIVER FOR FIXED POWER AMPLIFIER

BACKGROUND OF THE INVENTION

The present invention relates to an all digital power amplifier for analog signals.

In the art relating to acoustic signals it is frequently important to provide a power output signal which faithfully relates to an amplified version of the characteristics of the originating analog input signal. This is a particularly significant requirement of systems involving underwater sound. Heretofore, acoustic signals have been converted to corresponding electrical, audio signals and amplified by means of analog amplification systems. Such analog amplification systems for power amplification are frequently subject to discrepancies due to such problems as amplitude drift, linearity, or temperature effects. Overcoming such effects in analog circuits are complex, costly and sometimes difficult to implement.

SUMMARY OF THE INVENTION

It is, accordingly, an object of the present invention to provide an improved power ampifier system which obviates the foregoing difficulties.

It is another object of the present invention to provide an improved power amplifier system as set forth which obviates analog amplification circuitry.

It is a further object of the present invention to provide an improved power amplifier system as set forth which features digital amplification circuitry.

In accomplishing these and other objects, there has been provided, in accordance with the present invention, a digital power amplifier system in which an analog signal is converted to a corresponding digital signal and is, in turn, applied as input signals in a digital offset binary format to a digital pulse width symmetrical or single edge modulator. The digital pulse width modulated signals are amplified in a digital or switching power amplifier. The resulting signals are then passed through a tuning or filter circuit to produce an analog signal or modulated carrier having a desired frequency and wave shape characteristics. The analog signal or modulated carrier is then applied to a suitable load device. In the thus provided amplification system, all of the signal processing and amplification is accomplished through digital or power switching circuitry with no analog influence until the amplified signals are applied to the tuning or filter elements.

BRIEF DESCRIPTION OF THE DRAWINGS

A better understanding of the present invention may be had from the following detailed description when read in the light of the accompanying drawings in which.

DETAILED DESCRIPTION

Figure 1:
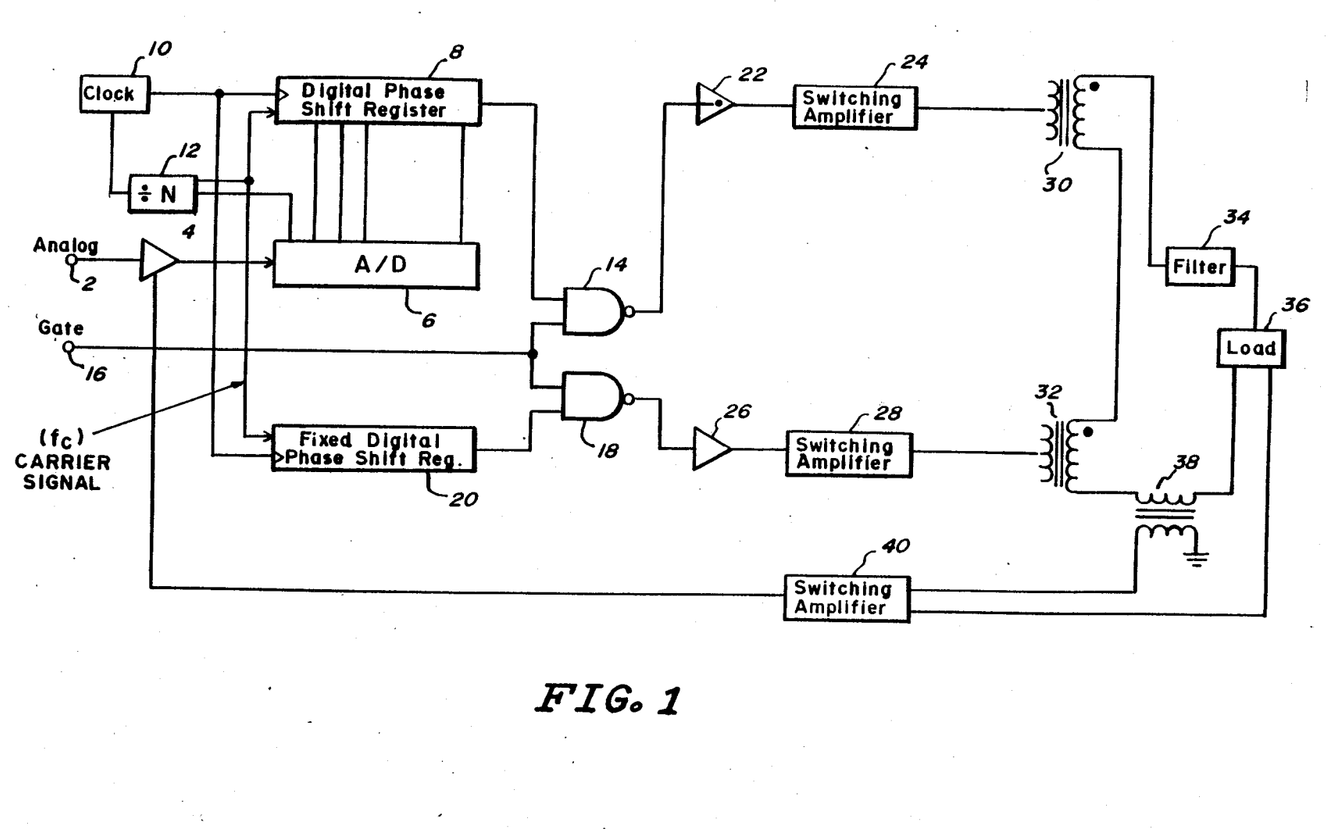
FIG. 1 is a schematic block diagram of an embodiment of one form of the present invention.

Referring now to the drawings in more detail, there is shown in FIG. 1 an input terminal 2 to which an analog input signal is applied. The analog input signal is amplified in an amplifier 4 and applied as input signal to an analog-to-digital (A-D) converter 6. The output signals from the A-D converter 6 are applied as control input signals with suitable interface circuits to a variable digital phase shift register 8. The shift register 8, in the exemplary embodiment, may be type 14557 integrated circuit chip.

The shift register 8 is clocked by a high frequency clock 10. The clock unit 10 also feeds into a divide by N circuit 12 which provides output clock signals which are submultiples of the frequency of the clock circuit 10. One output signal from the frequency divider 12 is applied as a clocking signal for the A-D converter 6. The clocking signal applied to the A-D converter must be of a frequency which is several orders of magnitude higher than the highest anticipated frequency in the analog input signal applied to the terminal 2. The other output clock signal from frequency divider 12 provides the input carrier signal ($f_c$) to the shift registers 8 and 20 for ultimate phase shifting as required. In this case, but not limited to, approximately 50,000 HZ.

The output of the digital phase shift register 8 is applied as one input to a NAND gate 14 the other input to the NAND gate 14 is from a gating signal applied to an input terminal 16. The gate terminal 16 is also connected to one input terminal of a second NAND gate 18. The clock signal from the clock circuit 10 is also applied as an input signal to a fixed digital phase shift register 20, the output of which is connected to a second input terminal of the NAND gate 18.

The output of the NAND gate 14 is connected through a buffer amplifier 22 to a first switching power amplifier 24. Similarly, the output of the gate 18 is connected through a buffer amplifier 26 to a second switching power amplifier 28. The output of the switching power amplifier 24 is applied across the terminals of the primary winding of an output transformer 30. In a like manner, the output of the second switching power amplifier 28 is connected across the terminals of the primary winding of a second output transformer 32. One terminal of the secondary winding of the transformer 30 is connected, observing winding polarities, to one terminal of the secondary winding of the transformer 32. The other terminal of the secondary winding of the transformer 30 is connected through a filter 34 to one input terminal of a load 36. The other terminal of the secondary winding of the transformer 32 is connected through the primary winding of a feedback transformer 38 to a second input terminal of the load 36.

The secondary winding of the current monitoring feedback transformer 38 is connected as a voltage input to a feedback network 40. A connection 42 from the load to the feedback network 40 applies a feedback voltage to the feedback network 40. The feedback network 40 combines the voltage and representative current feedback signals to provide a power feedback signal to effectively linearize the analog amplifier 4 if required in ultimate operation.

In operation, in an exemplary embodiment, the clock signal generator 10 provided a clock signal having a frequency on the order of 5.29 megacycles. That signal is applied as input signal to the digital phase shift register 8 and to the fixed digital phase shift register 20. As hereinbefore noted, the shift register 8 is characterized in that the phase shift of the applied signals is controllable by a series of inptu control signals. These control signals are supplied by the digital output of the A-D converter 6 through adequate interface circuitry. The analog input signals applied to the terminal 2 and amplified by the amplifier 4 may be in the nature of audio signals derived from numerous applicable sources such as audio oscillators, hydrophones, etc. The amplified analog signals, as noted, are applied as input signals to the A-D converter 6. The A-D converter 6, in turn, is gated or clocked by a clock signal having a frequency on the order of 1 MHz. As indicated, the clock signal for the A-D converter may be derived from the clock signal generator 10 and in the exemplary embodiment, the divide by N circuit 12 may be on the order of a divide by 5 circuit.

In an exemplary embodiment, it has been found that an A-D converter having a six-bit digital output provides an adequate response characteristic to effectively control the phase shift of the register 8. It will be appreciated, of course, that the present invention is not limited to a six-bit output from the A-D converter. In fact, an A-D converter having a greater number of bits in its output would provide a greater dynamic range in the output of the phase shift register 8.

The clock signals from the signal generator 10 are also applied to the fixed delay digital phase shifter 20. Preferably, but depending upon operating mode desires the output of the fixed digital phase shift register 20 is arranged to be substantially 90° out of phase with the unmodulated output of the shift register 8.

The output of the shift register 8 may be applied through a buffered amplifier to the input of the switching amplifier 24. The switching amplifier 24 provides a power amplification of the output of the phase shift register 8. Similarly, the output of the fixed phase shift register 20 may be applied through a buffer amplifier 26 to the input of the switching amplifier 28. This switching amplifier 28, in turn, provides a power amplification of the output of the shift register 20. Both the switching amplifier 24 and the switching amplifier 28 operate directly on the digital signals providing the required degree of digital precision in the amplification of the applied signals.

If, for some reason, it is desired to provide digital signals from the shift registers 8 and 20 to their respective power switching amplifiers 24 and 28 at a sampling rate lower than that provided by the shift registers themselves, a gating circuit comprising the NAND gates 14 and 18 are interposed between the output of the registers 8 and 20 and their corresponding switching amplifiers. A control gating signal of the desired sampling frequency is then applied to the input gating terminal 16 to control the gating of the signals into the switching amplifiers 24 and 28.

The output of the switching amplifiers 24 and 28 are transformer coupled, by means, respectively, of the transformers 30 and 32 to the output circuit including a tuning or filter circuit 34 and the load device 36. The tuning or filter circuit 34 recovers and restores the desired power amplified analog amplitude modulated signal and applies that amplified signal to the load device 36. The load device 36 is, of course, a suitable apparatus which responds to the power amplified analog signal for a desired end. The transformer 38 coupled in the output circuit provides a representative current feedback signal to the feedback network 40 while the connection 42 provides a voltage feedback from the load device 36 to the feedback network 40. The feedback network 40 then provides a processed signal for feeding back to the input amplifier 4 as a composite linearizing feedback signal.

Figure 2:
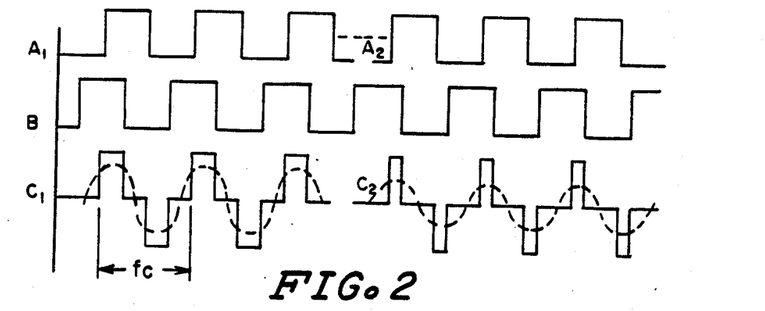
FIG. 2 is a set of wave shapes which may be useful in understanding the invention set forth in FIG. 1.

As may be seen in FIG. 2 curve $A_1$ and curve $A_2$ represent the output of the switching amplifier 24 in response to the signal controlled phase shift of the signal through the phase shifter 8. Curve B represents the output of the switching amplifier 28 in response to the fixed digital phase shift of the signal through the phase shifter 20. In curve B it may be seen that the phase relationship of the output signals from the phase shifter 20, and hence through the switching amplifier 28 remains at a constant value while in curve $A_1$ and curve $A_2$ it may be seen that as a result of a change in the applied analog signal the phase of the output signal from the switching amplifier 24 relative to the phase of the signal output from the switching amplifier 28 changes. When those signals are combined through the transformer secondaries 30 and 32 a composite wave form is generated as shown in solid line in curve $C_1$ and $C_2$. As those signals are passed through the tuning or filter circuit 34, an analog signal, but not limited to, such as dotted line form in curve $C_1$ and $C_2$ is recovered representing the amplitude level and/or variations of the original input analog signal but in amplified form.

As set forth herein it may be seen that from the input to the A-D converter to the output of the output power transformers 30 and 32 the entire amplification process is accomplished through digital means alone, thereby avoiding the difficulties with analog power amplification. In the form of the invention shown in FIG. 1 there is provided a so-called Class S amplification wherein the output digital signals are of the same frequency as the clocking carrier signal ($f_c$) of the digital phase shift register 8 and 20 with amplitude modulation.

Figure 3:
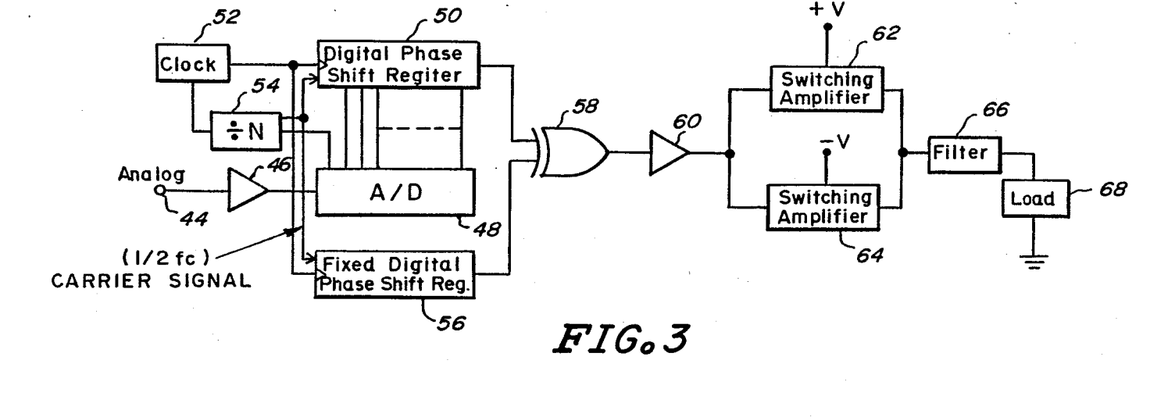
FIG. 3 is a schematic block diagram illustrating a second embodiment of the present invention.

In FIG. 3 there is illustrated a switching power amplifier constructed in accordance with the present invention and appearing in a so-called Class D single edge modulated mode wherein the output digital signal is double the frequency of the input digital signal in the digital phase shift registers. In FIG. 2 an analog signal is applied to an input terminal 44 and from thence through a buffer amplifier 46 to the input of an A-D converter 48. The digital output at the A-D converter 48 is applied as control signals through adequate interface circuitry to the control input of a variable digital phase shift register 50. Input signals to the shift register 50 are provided by a clock signal generator 52. As before, a clock signal for the A-D converter 48 is obtained from the clock signal generator 52 by means of a divide by N circuit 54. A fixed digital phase shift register 56 has input clock signals also provided by the clock signal generator 52. The other output clock signal from frequency divider 54 provides the same input carrier signal $f_{c/2}$ as before except it is one-half the output carrier frequency. Thus far the components of the circuit illustrated in FIG. 3 are substantially identical to those shown in FIG. 1.

The output of the variable digital phase shift register 50 is applied to one input terminal of an EXCLUSIVE OR gate 58. The output of the fixed digital phase shift register 56 is applied to the other input terminal of the EXCLUSIVE OR gate 58. The output of the EXCLUSIVE OR gate 58 is applied to the input of a buffer amplifier 60 the output of the buffer amplifier is applied to a pair of switching power amplifiers 62 and 64 connected in a half-bridge configuration. The output of the switching amplifier combination is taken from the junction between the two amplifiers and is passed through a low pass filter 66 and through a load 68.

Figure 4:
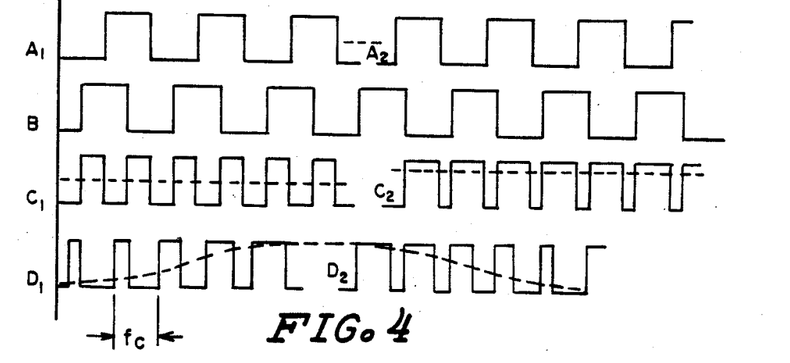
FIG. 4 is a set of wave shapes which will be useful in the understanding of the invention as illustrated in FIG. 3.

The operation of the circuit shown in FIG. 3 up to the point of the output of the digital phase shift register 50 and the fixed digital phase shift register 56 is identical to the corresponding circuit elements of FIG. 1, as evidenced by curves $A_1$, $A_2$ and curve D of FIG. 4. The output signals from the phase shift register 50 and the shift register 56 are combined in the EXCLUSIVE OR gate 58. The unique characteristic of the EXCLUSIVE OR gate 58 is that the combination of digital signals input thereto provide a double frequency output signal as illustrated in curve $C_1$ and $C_2$ of FIG. 4. The dotted lines on curves $C_1$ and $C_2$ of FIG. 4 represent the relative magnitude of the analog signal producing a change in distribution or pulse width single edge modulation of the input signals as represented by the solid line portions of the curves $C_1$ and $C_2$. Again the switching amplifiers 62 and 64 provide a power amplification of the combined signals issued from the EXCLUSIVE OR gate 58. Here again, from the A-D converter through the switching amplifier 62 and 64, the power amplification is accomplished through digital means alone. The filter 66 recovers in amplified form, the original analog input signal which is then applied to the load 68. The half-bridge configuration of the switching amplifiers 62 and 64 provide a unipolar output characteristic of both the combined digital pulses and the resultant analog signal represented by the dotted line in curve $D_1$ and $D_2$ of FIG. 4.

Figure 5:
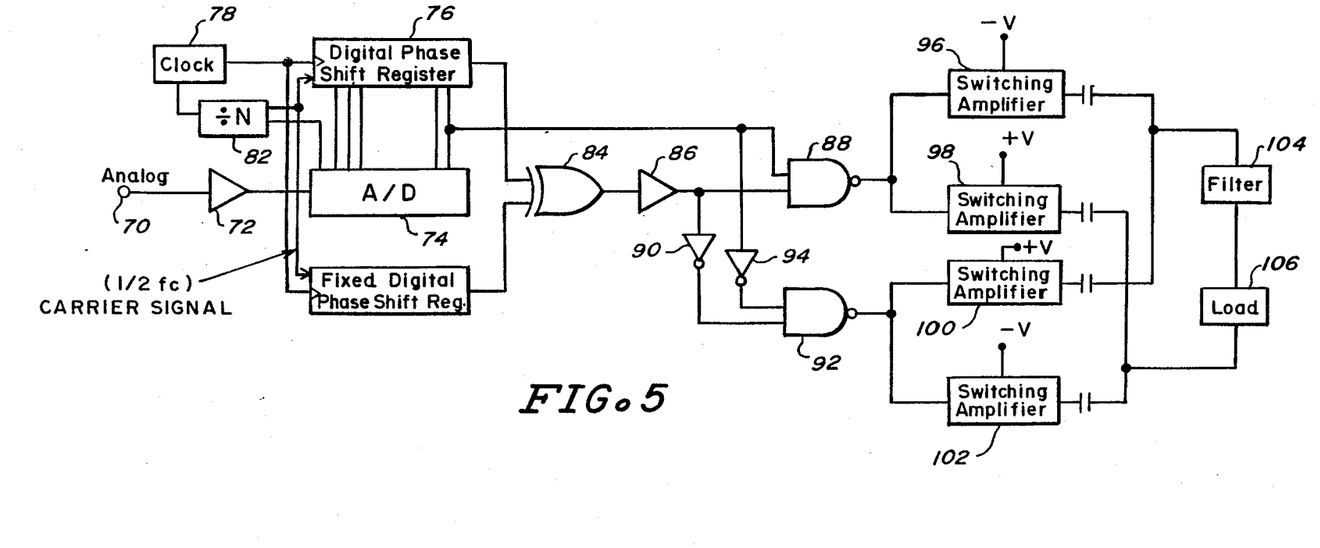
FIG. 5 is a schematic block diagram illustrating a further embodiment of the present invention.

In FIG. 5 there is shown a further embodiment of the digital power amplifier of the present invention. Once more the analog input signal is applied to an input terminal 70, through a buffer amplifier 72 to the input of an A-D converter 74. The digital output of the A-D converter 74 is applied as input control signals to variable digital phase shift register 76.

Again, a clock signal generator 78 provides input signals to the shift register 76 as well as to a fixed digital phase shift register 80. The A-D converter 74 is clocked by a signal derived from the clock signal generator 78 through a divide by N circuit 82. The output of the variable digital phase shift register 76 and the output of the fixed digital phase shift register 80 are combined as the two inputs to an EXCLUSIVE OR gate 84. The output of the EXCLUSIVE OR gate 84 is applied to the input of a buffer amplifier 86. The circuitry of FIG. 5 thus far described is identical to the corresponding components discussed and illustrated in FIG. 3.

Figure 6:
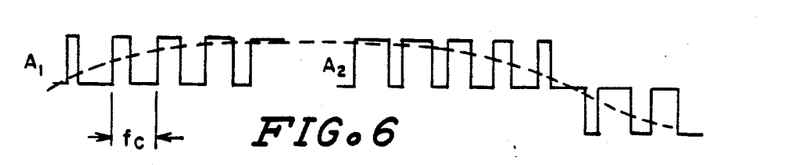
FIG. 6 is a wave shape which is helpful in understanding the invention set forth in FIG. 5.

The form of the invention illustrated in FIG. 5 includes a full bridge configuration for the power switching amplifiers. Thus, the output of the buffer amplifier 86 is applied directly to one input terminal of a NAND gate 88 and, through an inverter 90 to one input of a NAND gate 92. The most significant bit position of the A-D converter 74 is taken as a SIGN signal which is applied directly to the second input of the NAND gate 88 and, through an inverter 94, to the second input of the NAND gate 92. The output of the NAND gate 88 is applied to the input of two oppositely biased power switching amplifiers 96 and 98, respectively. The output of the NAND gate 92 is applied to the input of a second pair of oppositely biased power switching amplifiers 100 and 102, respectively. When the NAND gate 88 is enabled, the output of the switching amplifiers 96 and 98 are coupled across the output filter circuit 104 and the load device 106. On the other hand, when the NAND gate 92 is enabled, the output of the switching amplifiers 100 and 102 are coupled across the output filter 104 and the load 106. Since the output pulses from the switching amplifiers 96 and 98 to the output circuit will be of opposite polarity with respect to the pulses from the switching amplifiers 100 and 102, the recovered analog signal through the load 106 will be bipolar in nature as illustrated in FIG. 6.

Figure 7:
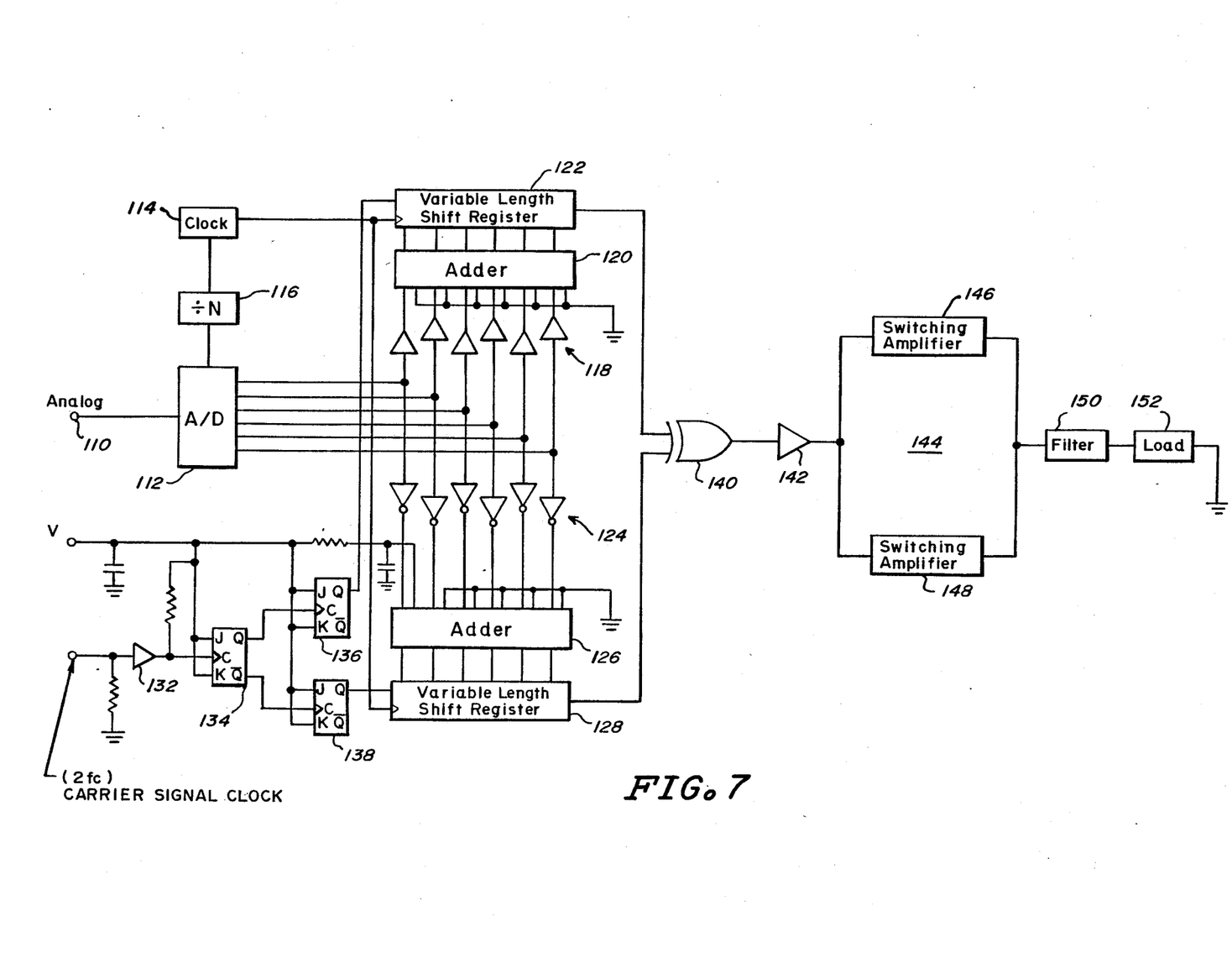
FIG. 7 is a schematic block diagram illustrating a still further embodiment of the present invention.

In the form of the invention shown in each of FIGS. 1, 3 and 5, the pulse width modulation has been in the nature of single edge modulation. In FIG. 7 there is shown a form of the invention which provides double edge or symmetrical pulse width modulation. As before, analog input signals are applied to an input terminal 110 as input signals to an A-D converter 112. A clock signal generator 114 is coupled through a divide by N circuit 116 to provide a clocking signal for the A-D converter 112. Here, too, the A-D converter is illustrated as providing a six-bit output. It will be appreciated that the six-bit representation is merely exemplary but a greater number of bits will produce an output signal with a greater dynamic range and still fall within the scope of the present invention. The output signals from the A-D converter 112 are applied, respectively, through a first set of non-inverting buffers 118 to the corresponding input terminals of a full adder circuit 120. The correlative input terminals of the adder 120 are connected to ground or logic zero. In an exemplary embodiment, the adder 120 was formed by the use of two four-bit adders such as integrated circuit chips 14008. The output of the adder 120 is applied as input control signals to a variable delay shift register 122. As in the other forms of the invention herein illustrated, the shift register 122 in the exemplary embodiment may be a 14557 integrated circuit.

The output signals from the A-D converter 112 are also applied, respectively, through a set of inverting buffers 124 to the corresponding input terminals of an adder 126. The adder 126 is of the same type as the adder 120. In the adder 126, however, the correlative input terminals on all but the least significant bit terminal are connected to ground or logic ZERO, while the least significant bit correlative input terminal is connected to a voltage source to supply a logic ONE input to each addition operation representative of successive values of the signals from the A-D converter 112. The output signals from the adder 126 are applied as control input signals to a variable delay shift register 128.

The shift registers 122 and 128 are clocked by the high frequency clock 114. In a preferred embodiment, this clock signal also has a frequency of approximately 5 MHz.

The input signals to the shift registers 122 and 128 are derived from a carrier signal source 130 which, in an exemplary embodiment, has a frequency of 100 KHz. The carrier signal 130 is connected through a suitable buffer 132 to the clock input of a J/K flip-flop 134. Both the J and the K input terminals of the flip-flop 134 are connected to a positive voltage supply. The Q output terminal of the flip-flop 134 is applied as an input signal to the clock terminal of a second J/K flip-flop 136 while the Q output terminals of the flip-flop 134 is connected to the clock input terminal of a third J/K flip-flop 138. Both the J/K input terminals of both of the flip-flops 136 and 138 are also connected to the positive voltage supply. The Q output terminal of the flip-flop 136 is connected to supply an input signal to the shift register 122 while the Q output of the flip-flop 138 is connected to supply an input signal to the shift register 128. With that arrangement, the input signals to the two shift registers 122 and 128 will be at a frequency one-fourth of the carrier signal source 130 and will be 90° out of phase with respect to each other.

The control signals applied to the shift registers 122 and 128 by the adders, respectively, 120 and 126 control the delay imparted to the propagation of the input signals through the respective shift registers, correspondingly shifting the relative phase of output signals from the shift registers. Accordingly, the two registers constitute variably controlled controllable phase shifters. It was noted that the digital signals applied from the output of the A-D converter 112 were inverted by the buffers 124 and applied through the adder 126 to control the delay in the shift register 128. A logic ONE was added to the least significant bit position of the adder 126 to compensate for the offset binary format of the input signal to the full adders 120 and 126 through buffers 118 and 124. In this respect, it may be noted that the buffers 118 and the adder 120 associated with the shift register 122 serve the primary purpose of compensating the signals applied to the shift register 122 for the propagation delay incurred in the buffer 124 and the adder 126 associated with the shift register 128. Thus, with the control signals applied from the adder 120 to the shift register 122 being positive, the controlled delay will produce a shift in a first direction, of the signals transmitted through the shift register 122. On the other hand, the control signals applied through the inverting buffers 124 and the adder 126 are in a negative direction. Accordingly, the effective delay in the transmission of the signals through the shift register 128 will be of the same magnitude but in an opposite direction to that of the delay imposed on the signals output from the register 122.

The thus shifted signals propagated through the registers 122 and 128 are applied, respectively, to the two input terminals of an EXCLUSIVE OR gate 140. With the balanced and oppositely directed control of the two shift registers 122 and 128, the resulting output signal from the combining influence of the EXCLUSIVE OR gate 140 will be a symmetrically pulse width modulated digital signal. The circuit will function equally well with an EXCLUSIVE NOR gate substituted for the gate 140.

Since the flip-flop 134 divides the clock frequency of the carrier clock input 130 by 2, and the flip-flops 136 and 138 again divide the frequency of that signal by two, the frequency of the input signal to the variable length shift registers 122 and 128 is one-fourth the frequency of the input carrier clock signal 130. Since the combining effect of the EXCLUSIVE OR gate 140 doubles the frequency of the signals from the shift registers 122 and 128, the output signal from the EXCLUSIVE OR gate 140 is one-half of the frequency of the clock signal source 130. That signal is applied through a driver 142 to power amplifier means 144. As illustrated, that power amplifier means 144 is comprised of a pair of digitally responsive switching amplifiers 146 and 148. These are illustrated as being connected in a half-bridge configuration such as is illustrated in FIG. 3. On the other hand, the power switching amplifier means 144 may be connected in a full-bridge configuration such as is illustrated in FIG. 5. The output signal of the power amplifier 144 is an amplified and level shifted version of a symmetrically pulse width modulated signal output from the EXCLUSIVE OR gate 140.

To this point in the herein described system, all of the signals and manipulations thereof have been in digital form. At this point the power amplified signals output from the amplifier 144 may be converted to a corresponding analog signal by means of the filter 150. The output of the filter 150 is then applied to control the operation of the appropriate load device 152 as hereinbefore noted.

In operation, a digital signal is output from the A-D converter 112 which is the digital representative of an elemental segment of the analog input signal 110. As hereinbefore mentioned, those digital signals are applied to the control input elements of the shift registers 122 and 128, respectively.

The clock carrier signal applied to the input terminal 130, as noted, may be, but not limited to, of the order of 100 KHz. The frequency of that signal is divided by two by operation of the flip-flop 134. A representation of the output at the Q terminal of the flip-flop 134 is shown on curve A of FIG. 8. Similarly, a representation of the output at the $\overline{Q}$ output of the flip-flop 134 is shown at curve B of FIG. 8. As noted before, the Q output of the flip-flop 134 is applied to the clock input of the flip-flop 136 where the frequency of that clock signal is again divided by two by operation of the flip-flop 136 as illustrated in curve $C_1$ of FIG. 8. Similarly, the $\overline{Q}$ output of the flip-flop 134 is applied to the clock input of the flip-flop 138 where the frequency of that signal is also divided by two by operation of the flip-flop 138 as illustrated in curve $D_1$ of FIG. 8. It will be noted that the curve of the Q output of the flip-flop 136 is 90° out of phase with the curve of the Q output of the flip-flop 138. The signal represented by the curve $C_1$ is applied as the input signal to the shift register 122. The shift register 122 is characterized in that there is a time delay in the propagation input signal, curve $C_1$, through the shift register to the output terminal thereof. That time delay may be controlled to be variable under control of the signals applied thereto from the adder 120. These signals from the adder 120, of course, represent the digital equivalent of the segmental portion of the analog signal applied to the A-D converter 112. The magnitude and direction of variations in the delay time is a function of the value of the digital signal applied from the adder 120 to the control inputs of the shift register 122. As an example, there is illustrated in curve $C_2$ of FIG. 8 a change in the negative direction of the propagation delay to the shift register 122.

Similarly, the Q output of the flip-flop 138 is applied as the input signal to the shift register 128. As hereinbefore noted, the shift register 128 is substantially identical to the shift register 122. Accordingly, there is an established delay between the signals input to the shift register and the corresponding signals appearing at the output thereof, due to the propagation time through the shift register 128. As was before noted, the delay in propagation through the shift register 32 is variable under control of the control signals applied thereto from the adder 126. The signals applied to the shift register 128 from the adder 126 are identical to those applied to the shift register 122 from the adder 120 with the exception that they are inverted. Accordingly, the incremental change in the delay in the propagation of the signals through the shift register 128 is identical to that in the shift register 122 but with the incremental delay chnge being in the opposite direction from that in the shift register 122. This is illustrated in $D_2$ of FIG. 8.

The output signals from the shift register 122 and the shift register 128 are applied, respectively, to the two input terminals of the EXCLUSIVE OR gate 140. When the control signals applied to the shift registers 122 and 128 from the adders 120 and 126, respectively, are at a value corresponding to a zero value for the ultimate resulting signal there is no resulting shift in the delay of the signals represented by the curves $C_1$ and $D_1$. When those signals are combined in the EXCLUSIVE OR gate 44 the resulting double frequency signal appearing at the output thereof will be a symmetrical wave as represented by the curve $E_1$ of FIG. 8. On the other hand, if the value of the control signals applied to the shift registers 122 and 128 from the adders 120 and 126, respectively, are such as to represent a positive value for the ultimate resulting signal, the delays through the two shift registers 122 and 128 are represented by the curves $C_2$ and $D_2$, respectively in FIG. 8. When those two signals are combined in the EXCLUSIVE OR gate 140, the result is a double frequency pulse width modulated signal as represented by curve $E_2$ of FIG. 8. The curve $E_2$ may, for example, represent a maximum positive value for a resultant curve. If the delays in the shift registers 122 and 128 had been controlled to be in the opposite directions, then the relative distribution of the positive and negative elements of the curve $E_2$ would have been reversed. This would, in turn, have represented a maximum negative value of the resultant curve.

Figure 8:
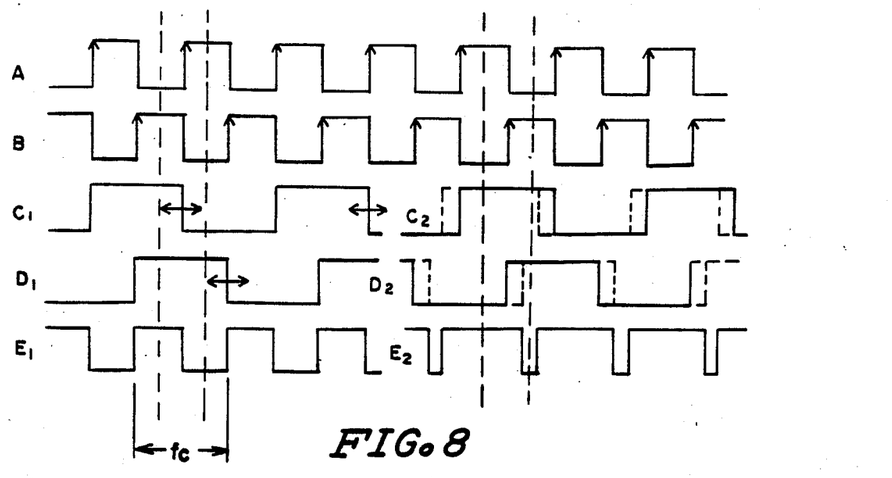
FIG. 8 is a set of wave shapes which may be helpful in understanding the invention as set forth in FIG. 7.

It will be apparent, of course, that the illustrated relative values of the curves $E_1$ and $E_2$ are representative of the instantaneous value of an elemental segment of the input control signal. The A-D converter, in response to the clocking signal from the divide by N circuit 116, provides updated digital signals to the input control of the shift registers 122 and 128 at a rate commensurate with the frequency of the clocking signal. In the exemplary embodiment, that clocking frequency may be on the order of one MHz. Thus, the output of the OR gate 140 would be a series of symmetrically pulse width modulated digital signals.

That series of symmetrically pulse width modulated signals is buffered and level shifted by the buffer 142 and power amplified by the digital switching amplifiers 146 and 148 representing the power amplifier 144. The amplified symmetrical pulse width modulated signals being lower in harmonic absolute levels are then converted by the filter 150 to an analog signal having the amplitude and frequency characteristic determined by the characteristics of input analog signal applied to the input of the A-D converter 112. The analog signal from the filter 150 has a power level commensurate with properly driving the load unit 152.

Thus there has been provided in accordance with the present invention, an improved substantially all digital signal power amplifier which is characterized in, first, a higher overall efficiency of operation, second, an avoidance of the thermal linearity and drift characteristics associated with comparable analog power amplifiers, third, an avoidance of the sometimes difficult implementation of comparable analog circuits and fourth, a lower harmonic level in the case of symmetrical modulation method.

The embodiments of the invention in which an exclusive property of privilege is claimed as defined as follows:

1. A signal control circuit including a digital power amplifier for continuously variable analog signals, said power amplifier comprising:
   analog input signal means;
   analog-to-digital converter means connected to said analog input signal means to receive continuously variable analog signals therefrom;
   said analog-to-digital converter means being operative to produce digital output signals therefrom representative of successive incremental values of said analog signals;
   a digital pulse width modulating means including controllable phase displacement means for producing a succession of pulse width modulated output signals;
   connecting means coupling said analog-to-digital converter means to said modulating means to control said phase displacement means of said modulating means in accordance with said digital output signals from said converter means; and
   switching power amplifier means coupled to said modulating means to amplify said pulse width modulated output signals.

2. A signal control circuit as set forth in claim 1 wherein said phase displacement means of digital pulse width modulating means includes:
   a first and a second shift register having an input connection and an output connection, at least one of said shift registers being of the type having a controllable delay and having control input connections;
   said connecting means coupling said analog-to-digital converter means output signals to said control input connections;
   digital input signal means connected to apply digital input signals to said input connections of said first and second shift register; and
   combining means coupled to said output connections of said first and second shift registers to provide a resultant pulse width modulated digital output signal from said combining means.

3. A signal control circuit as set forth in claim 2 wherein:
   said first shift register is of the type having a controllable delay and said second shift register is of the type having a fixed delay and having an output signal substantially 90° out of phase with an unmodulated output signal from said first shift register to provide a single edge pulse width modulated output signal.

4. A signal control circuit as set forth in claim 3 wherein said switching amplifier means includes a first switching power amplifier coupled to the output connection of said first shift register to amplify the output signals therefrom, a second switching power amplifier coupled to the output connection of said second shift register to amplify the output signals therefrom, and said combining means being coupled to the outputs of said first and second switching power amplifier.

5. A signal control circuit as set forth in claim 3 wherein said combining means comprises an EXCLUSIVE OR gate having a first input connection coupled to said output connections of said first shift register and having a second input connection coupled to said output connection of said second shift register, and said switching power amplifier means is coupled to the output of said gate.

6. A signal control circuit as set forth in claim 5 wherein said switching power amplifier means comprises a first and a second switching power amplifier, said first and second switching power amplifiers being connected in a half-bridge configuration.

7. A signal control circuit as set forth in claim 5 wherein said switching power amplifier means comprises a first and a second pair of switching amplifiers connected in a full-bridge configuration.

8. A signal control circuit as set forth in claim 7 wherein means are provided for obtaining a SIGN signal from said analog-to-digital converter means and including gating means responsive to said SIGN signal for selectively enabling one of said first or second pair of switching amplifiers.

9. A signal control circuit as set forth in claim 2 wherein said first and second shift registers are both of the type having a controllable delay and each having control input connections and wherein said connecting means couples said analog-to-digital converter means output signals to said control input connections of both of said shift registers to provide a digital symmetrical pulse width modulated output signal.

10. A signal control circuit as set forth in claim 9 wherein said connecting means includes a first coupling circuit means connected between said analog-to-digital converter means and said control input connections of said first shift register, and a second coupling circuit means connected between said analog-to-digital converter means and said control input connections of said second shift register; said first coupling circuit means including buffering means and a full adder; and said second coupling circuit means including signal inverting means and a full adder.

11. A signal control circuit as set forth in claim 10 wherein a digital input signal means is connected to apply digital input signals to said input connections of said first and second shift registers, said digital input signal means including means for developing a first train of pulses connected for application of said first train of pulses as input signals to said input connections of said first shift register; and means for developing a second train of pulses identical to but 90° phase displaced with respect to said first train of pulses, said means for developing said second train of pulses being connected to apply said second train of pulses as input signals to said input connection of said second shift register.

12. A signal control circuit as set forth in claim 11 wherein said second coupling circuit means includes means for adding a logic ONE to said digital signals from said analog-to-digital converter means inverted and applied to said control input connections of said second shift register.

* * * * *